United States Patent
Shim

(10) Patent No.: US 9,030,959 B2
(45) Date of Patent: *May 12, 2015

(54) APPARATUS AND METHOD FOR MONITORING QUALITY METRICS ASSOCIATED WITH A WIRELESS NETWORK

(71) Applicant: Cisco Technology, Inc., San Jose, CA (US)

(72) Inventor: Choon B. Shim, Ijamsville, MD (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/013,204

(22) Filed: Aug. 29, 2013

(65) Prior Publication Data

US 2014/0003277 A1     Jan. 2, 2014

Related U.S. Application Data

(63) Continuation of application No. 12/971,530, filed on Dec. 17, 2010, now Pat. No. 8,559,327, which is a continuation of application No. 11/403,202, filed on Apr. 13, 2006, now Pat. No. 7,894,488.

(51) Int. Cl.
| | |
|---|---|
| G01R 31/08 | (2006.01) |
| H04W 24/00 | (2009.01) |
| H04L 12/26 | (2006.01) |
| H04W 24/08 | (2009.01) |
| H04J 3/06 | (2006.01) |
| H04W 28/02 | (2009.01) |

(52) U.S. Cl.
CPC .............. *H04W 24/00* (2013.01); *G01R 31/08* (2013.01); *H04J 3/0667* (2013.01); *H04L 12/2602* (2013.01); *H04L 43/00* (2013.01); *H04L 43/0829* (2013.01); *H04L 43/0852* (2013.01); *H04L 43/087* (2013.01); *H04W 24/08* (2013.01); *H04W 28/02* (2013.01)

(58) Field of Classification Search
CPC ....................................................... H04W 24/00
USPC ......... 370/230, 235, 252–253, 412–427, 465, 370/503–545; 455/456.1, 550.1
See application file for complete search history.

(56) References Cited

U.S. PATENT DOCUMENTS

| | | |
|---|---|---|
| 5,193,151 A | 3/1993 | Jain |
| 6,243,568 B1 | 6/2001 | Detlef et al. |
| 6,625,126 B1 | 9/2003 | Kikinis |
| 6,728,215 B1 | 4/2004 | Alperovich et al. |

(Continued)

OTHER PUBLICATIONS

"U.S. Appl. No. 11/403,202, Final Office Action mailed Jul. 21, 2010", 20 pgs.

(Continued)

*Primary Examiner* — Iqbal Zaidi

(57) ABSTRACT

An apparatus and method for measuring metrics associated with a wireless network is described. One embodiment includes capturing a packet transmitted over a network and determining a minimum delay of a plurality of previously captured packets, where each previously captured packet of the plurality of previously captured packets is associated with a delay. The embodiment further includes determining a current overall delay of the packet based on features of the packet and calculating a congestion indicator based on the current overall delay and the minimum delay.

20 Claims, 6 Drawing Sheets

(56) References Cited

U.S. PATENT DOCUMENTS

| | | |
|---|---|---|
| 7,079,854 B2 | 7/2006 | Lee et al. |
| 7,672,402 B2 | 3/2010 | Veltman et al. |
| 7,873,077 B2 | 1/2011 | Downey et al. |
| 7,894,488 B2 | 2/2011 | Shim |
| 2002/0089930 A1 | 7/2002 | Aceves et al. |
| 2002/0101822 A1 | 8/2002 | Ayyagari et al. |
| 2002/0105911 A1 | 8/2002 | Pruthi et al. |
| 2003/0202528 A1 | 10/2003 | Eckberg |
| 2004/0043758 A1 | 3/2004 | Sorvari et al. |
| 2004/0170164 A1 | 9/2004 | LeBlanc et al. |
| 2005/0020279 A1 | 1/2005 | Markhovsky et al. |
| 2005/0094622 A1 | 5/2005 | Mallila |
| 2005/0135306 A1 | 6/2005 | McAllen et al. |
| 2005/0135316 A1 | 6/2005 | Cromer et al. |
| 2011/0085466 A1 | 4/2011 | Shim |

OTHER PUBLICATIONS

"U.S. Appl. No. 11/403,202, Non-Final Office Action mailed Jan. 6, 2010", 15 pgs.

"U.S. Appl. No. 11/403,202, Non-Final Office Action mailed Jun. 4, 2009", 11 pgs.

"U.S. Appl. No. 11/403,202, Non-Final Office Action mailed Nov. 14, 2008", 19 pgs.

"U.S. Appl. No. 11/403,202, Notice of Allowance mailed Oct. 12, 2010", 6 pgs.

"U.S. Appl. No. 11/403,202, Response filed Mar. 16, 2009 to Non Final Office Action mailed Nov. 14, 2008", 12 pgs.

"U.S. Appl. No. 11/403,202, Response filed May 6, 2010 to Non Final Office Action mailed Jan. 6, 2010", 9 pgs.

"U.S. Appl. No. 11/403,202, Response filed Sep. 21, 2010 to Final Office Action mailed Jul. 21, 2010", 10 pgs.

"U.S. Appl. No. 11/403,202, Response filed Oct. 2, 2009 to Non Final Office Action mailed Jun. 4, 2009", 11 pgs.

"U.S. Appl. No. 12/971,530, Non Final Office Action mailed Dec. 28, 2012", 26 pgs.

"U.S. Appl. No. 12/971,530, Notice of Allowance mailed Jun. 14, 2013", 15 pgs.

"U.S. Appl. No. 12/971,530, Response filed Mar. 26, 2013 to Non Final Office Action mailed Dec. 28, 2012", 12 pgs.

APPARATUS AND METHOD FOR MONITORING QUALITY METRICS ASSOCIATED WITH A WIRELESS NETWORK

CLAIM OF PRIORITY

This application is a continuation of and claims the benefit of priority under 35 U.S.C. §120 to U.S. patent application Ser. No. 12/971,530, entitled "APPARATUS AND METHOD FOR MONITORING QUALITY METRICS ASSOCIATED WITH A WIRELESS NETWORK", filed on Dec. 17, 2010, which is a continuation of U.S. patent application Ser. No. 11/403,202, entitled "APPARATUS AND METHOD FOR MONITORING QUALITY METRICS ASSOCIATED WITH A WIRELESS NETWORK," filed on Apr. 13, 2006, which is hereby incorporated by reference herein in its entirety.

FIELD OF THE INVENTION

The present invention relates to an apparatus and method for monitoring a wireless network, and more particularly, to an apparatus and method for measuring quality associated with a wireless network.

BACKGROUND

As data networks have expanded to include the transmission of various forms of information such as voice communication, network quality has become increasingly important in network administration. Measures of the quality of a network include, for example, effective bandwidth, congestion, packet delay, jitter, and/or packet loss rate. Because an end-to-end connection within a network can include multiple segments and/or links, quality measurements can be determined separately for each segment within the end-to-end connection or for the end-to-end connection as a whole. The quality values associated with a particular link and/or segment can fluctuate, particularly if the network employs a connectionless best effort protocol (e.g., internet protocol (IP)).

The variation of quality measurements associated with a link and/or segment are even more pronounced within a wireless network than in a wired network. The quality of a wireless network can change rapidly because mobile devices can easily associate and disassociate with the wireless network. For example, a wireless network can rapidly become congested resulting in a degradation of quality of service and complaints from users when several mobile terminals associate with a wireless segment and/or link in a short period of time. The inherent variation of a wireless network is further exacerbated by the non-linear relationship between quality measurements and the number of mobile terminals within the wireless network. Because current network protocols are not designed to adequately measure the quality of a dynamic wireless network, a need exists for a method and an apparatus for measuring quality within a wireless network.

DETAILED DESCRIPTION

A mobile monitoring device (which also can be referred to as a mobile monitoring agent or capturing device) captures packets that are transmitted over a wireless network and uses information associated with the captured packets to calculate various quality metrics. The wireless network can be, for example, a wireless local area network (wireless LAN) or a wireless voice over internet protocol (wireless VoIP) network. Quality metrics include, for example, quality-of-service (QoS) metrics such as packet delay, jitter, and/or packet loss rate, as well as quality metrics such as effective bandwidth and/or congestion. The packets can be transmitted within an ad-hoc wireless network or an infrastructure wireless network between one or more mobile terminals and/or access points. After the packets are captured, the mobile monitoring device filters and/or processes the packets to calculate quality metrics that can be associated with the wireless network, a mobile terminal(s), and/or an access point(s).

Figure 1:
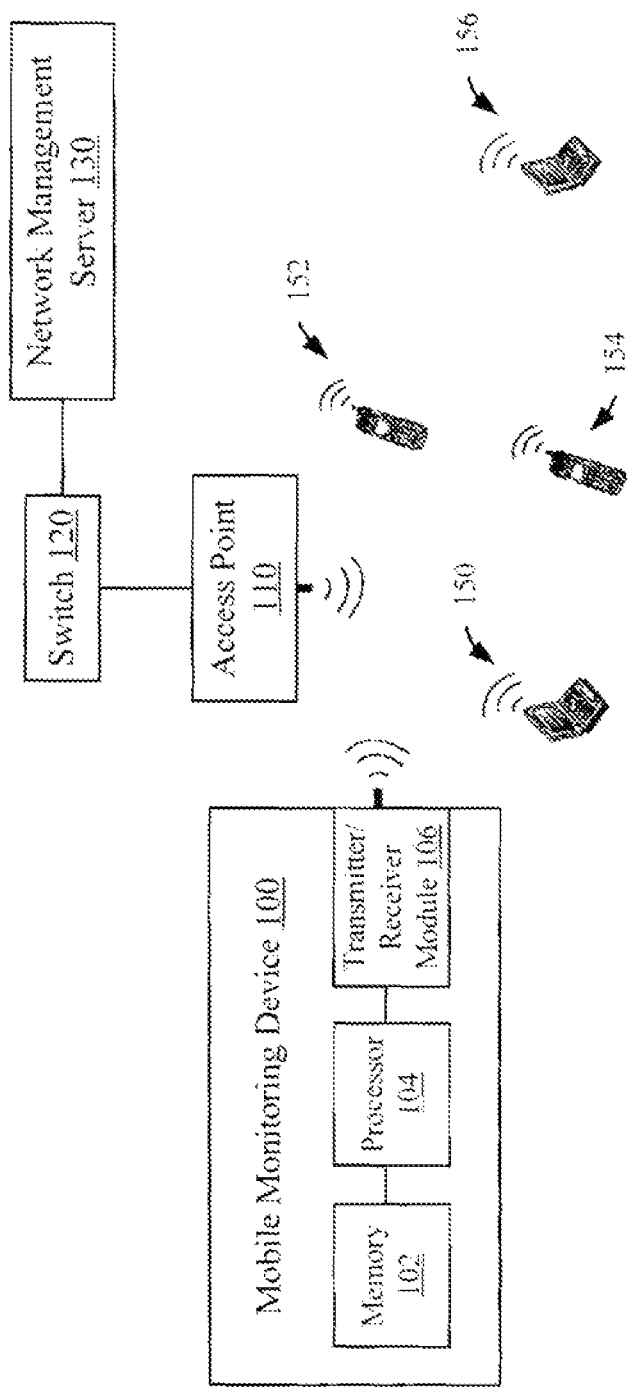
FIG. 1 illustrates an example of a mobile monitoring device monitoring wireless communication within an infrastructure wireless network, according to an embodiment of the invention.

FIG. 1 illustrates a mobile monitoring device 100 monitoring packets being sent and/or received (i.e., communication) within a wireless network, according to an embodiment of the invention. The mobile monitoring device 100 includes a memory 102, a processor 104 and a transmitter/receiver module 106. The mobile monitoring device 100 sends and/or receives signals and/or packets using the transmitter/receiver module 106 and processes the signals and/or packets using the processor 104. In some embodiments, the sending (i.e., transmitting) function associated with the transmitter/receiver module 106 and the receiving function associated with the transmitter/receiver module 106 can be separated into different devices (i.e., a separate transmitter module and receiver module). The memory 102 is used by the mobile monitoring device 100 to temporarily and/or permanently store information and/or data (e.g., values of parameters associated with packets) to perform any of the functions associated with the mobile monitoring device 100. The memory 102 can be any appropriate kind of fixed and/or removable memory such as, for example, flash memory or a hard drive.

The mobile monitoring device 100 receives, using the transmitter/receiver module 106, one or more packets being transmitted by an access point 110 and/or one or more mobile terminals 150-156 (i.e., mobile device) over the wireless network. The mobile monitoring device 100 calculates a quality metric(s) based on parameters associated with one or more packets using the processor 104. The parameters can be, for example, a record and/or information contained within a header of a packet (e.g., packet creation time). The processor 104 within the mobile monitoring device 100 can be configured to associate the quality metric(s) with the access point 110, the wireless network and/or one or more of the mobile terminals 150-156. The mobile monitoring device 100 is also configured to transmit, using the transmitter/receiver module 106, the calculated quality metric to, for example, a network management server 130, for example, for distribution to a user.

In this embodiment, the mobile terminals 150-156 communicate by sending and/or receiving packets via the access point 110. For example, mobile terminal 152 can transmit a packet to mobile terminal 154 by first, transmitting the packet to the access point 110. The access point 110 then processes the packet and retransmits it so that the packet can be received by the mobile terminal 154. The wireless network configuration shown in FIG. 1 can be referred to as an infra-structure mode because it includes a central device (i.e., access point 110) through which wireless communication occurs.

Because all communication in the infrastructure wireless network is managed through the access point 110, each device (e.g., mobile terminals 150-156 and the mobile monitoring device 100) attempting to engage in communication (e.g., receiving and/or sending packets) over the wireless network must first associate with the access point 110. The mobile monitoring device 100 and the mobile terminals 150-156 associate with the access point 110 by listening to and responding to a beacon signal transmitted by the access point 110. After the mobile terminals 150-156 and/or the mobile monitoring device 100 have associated with the access point 110, the mobile terminals 150-156 and/or the mobile monitoring device 100 can send and/or receive packets over the wireless network. Also, after the mobile terminals 150-156 and/or the mobile monitoring device 100 have associated with the access point 110, they can have access to the network management server 130 via switch 120.

The mobile monitoring device 100 captures packets transmitted via radio signals over a channel with which it is associated. The mobile monitoring device 100 can be configured to capture packets sent by mobile terminals 150-156 over more than one channel by associating with more than one channel used by one or more access points 110 and/or mobile terminals 150-156. The mobile terminals 150-156 can be any kind of appropriate mobile terminal capable of sending and/or receiving a packet such as, for example, a computer, a radio, a mobile phone, a personal digital assistant (PDA), etc. The packet(s) received by the mobile monitoring device 100 can be any type of packet such as, for example, real-time protocol (RTP) packets transmitting over an internet protocol (IP) wireless LAN. The mobile monitoring device 100 can capture not only packets, but any variety of communication signals that can be transmitted wirelessly.

The mobile monitoring device 100 can be configured to filter the packets (using the processor 104) that are received at the transmitter/receiver module 106 to calculate quality metrics based on only certain packets. The mobile monitoring device 100 can calculate quality metrics using, for example, only packets that are transmitted from mobile terminals 152 and 154. The mobile monitoring device 100 can filter out packets transmitting, for example, data so that a quality metric is based only on packets transmitting voice communication. The filtering can be based on filter criteria that are stored, for example, locally on the mobile monitoring device 100 in the memory 102. The filter criteria can be executed using the processor 104.

The mobile monitoring device 100 can calculate a variety of quality metrics including, but not limited to, a transport QoS metric, a delay metric, a jitter metric, and/or a packet loss metric. The mobile monitoring device 100 can, for example, calculate a packet loss metric by counting the number of packets lost based on packet sequence numbers extracted from, for example, the headers of a group of RTP packets being transmitted over a wireless network. The mobile monitoring device 100 can also calculate, for example, a jitter metric and/or a delay metric associated with a packet using standard jitter and/or delay formulas based on the creation time of the packet and the capture time of the packet (the time that the packet is captured by the mobile monitoring device 100).

In some embodiments, a mobile monitoring device can be configured to receive a packet transmitted over an ad-hoc wireless network (rather than an infrastructure wireless network) and calculate a quality metric based on information associated with the packet. In an ad-hoc wireless network a first mobile terminal can send and/or receive a packet directly from a second mobile terminal when the first mobile terminal detects and is acknowledged by the second mobile terminal. The first and second mobile terminals create an ad-hoc wireless network through which they can send and/or receive packets wirelessly.

Figure 2:
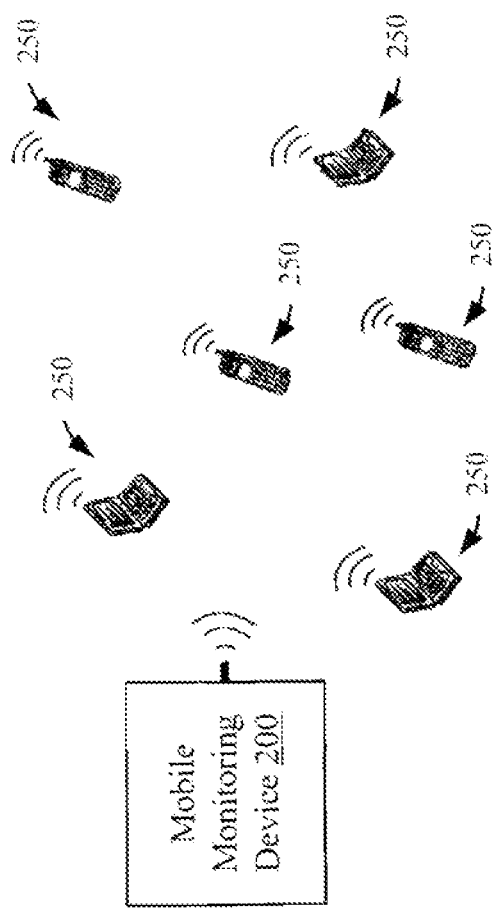
FIG. 2 illustrates a mobile monitoring device monitoring packets being sent and/or received between mobile terminals in an ad-hoc wireless network, according to an embodiment of the invention.

FIG. 2 illustrates a mobile monitoring device 200 monitoring packets being sent and/or received between mobile terminals 250 in an ad-hoc mode (i.e., peer-to-peer mode). An ad-hoc wireless network differs from an infrastructure wireless network in that communication does not occur through an access point. In other words, the mobile monitoring device 200 and/or mobile terminals 250 do not associate with an access point. Rather than capturing packets transmitted to and/or from an access point, the mobile monitoring device 200, in an ad-hoc wireless network, captures packets transmitted directly between mobile terminals 250 and uses information associated with those captured packets to generate quality metrics. Other than not communicating via an access point, the operation of the mobile monitoring device 200 in an ad-hoc wireless network is substantially the same as the operation of a mobile monitoring device in an infra-structure wireless network.

Figure 3:
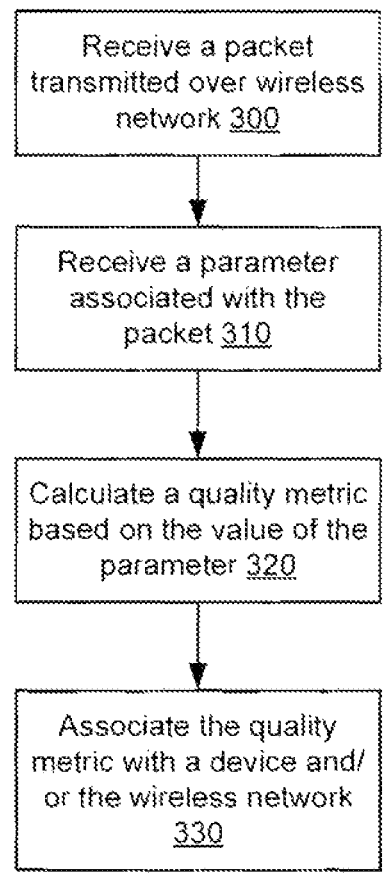
FIG. 3 is a flowchart that illustrates a method for monitoring a wireless network, according to an embodiment of the invention

FIG. 3 is a flowchart that illustrates a method for monitoring a wireless network. The figure shows that a packet (e.g., RTP packet) that is transmitted over a wireless network is first received at 300. The packet can be a packet that was selected from one of several packets based on, for example, filter criteria.

After the packet is received at 300, a parameter associated with the packet is received at 310. The parameter can be any type of parameter associated with the packet such as a record included in the header of the packet. The parameter can also be related to information not contained in, but associated with the packet, such as a capture time corresponding to the time that the packet was captured by, for example, a mobile monitoring device. In some embodiments, more than one parameter and/or more than one value for a particular parameter can be received, calculated and/or derived.

After the parameter is received at 310, a quality metric is calculated based on the value of the parameter at 320. The quality metric can be, for example, a jitter value or a congestion indicator that can be derived using the value of the parameter. Finally, the calculated quality metric is associated with a device (e.g. mobile terminal, mobile monitoring device) and/or the wireless network 330. If the parameter is specific to, for example, a particular packet, the quality metric can be associated with a mobile terminal that transmitted that packet. In some embodiments, the quality metric calculated using the parameter can be, for example, associated with the wireless network as a metric that is representative of some aspect of the wireless network.

Figure 4:
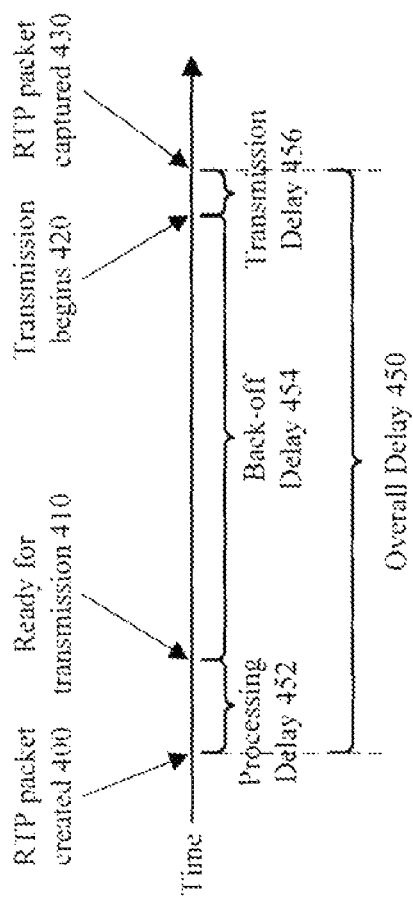
FIG. 4 is a time line that illustrates delays that can contribute to the overall delay of a packet when transmitted over a wireless network, according to an embodiment of the invention
Figure 5:
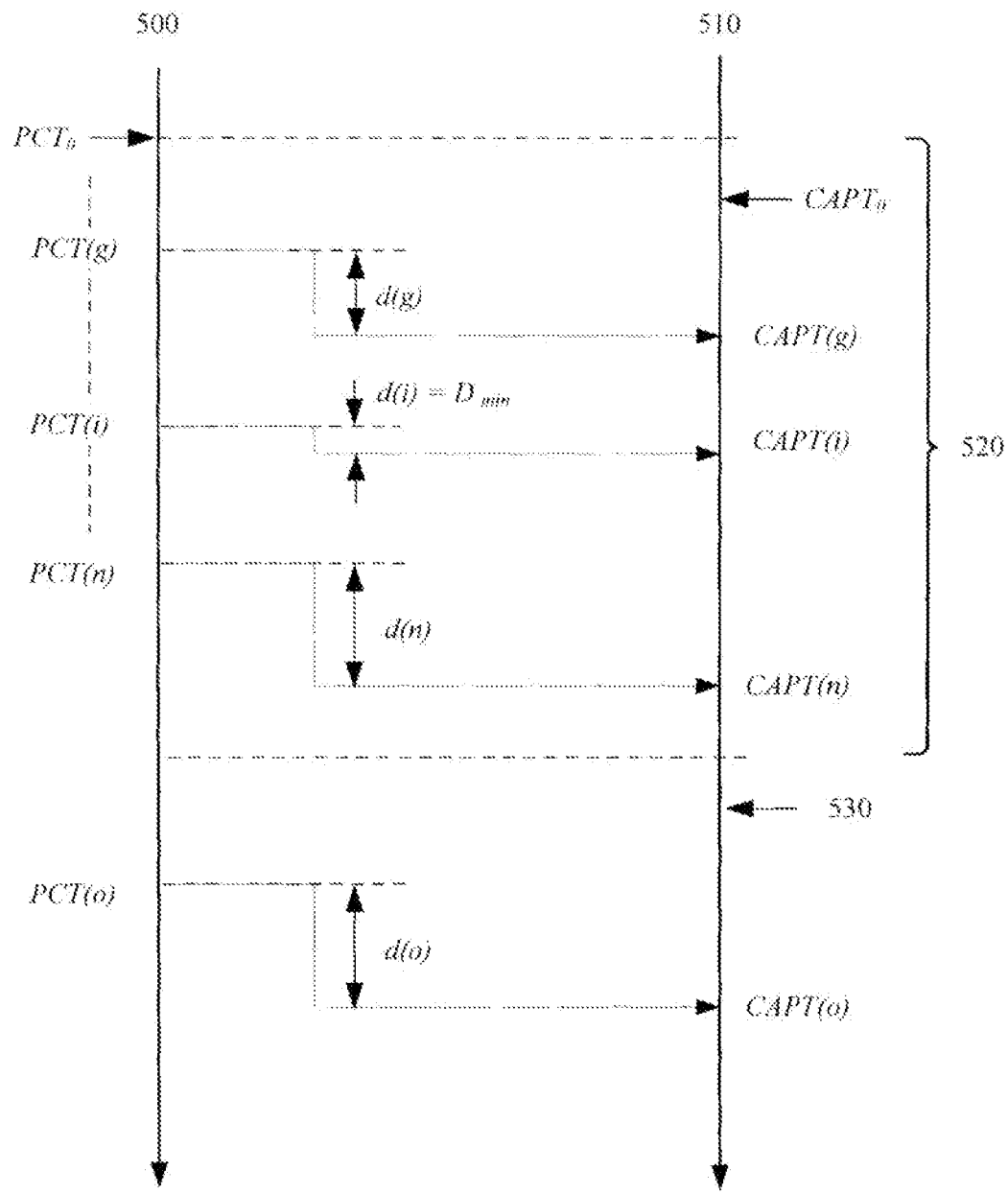
FIG. 5 is a graph that illustrates an example embodiment of time clocks associated with a capturing device and a mobile terminal, according to an embodiment of the invention.
Figure 6:
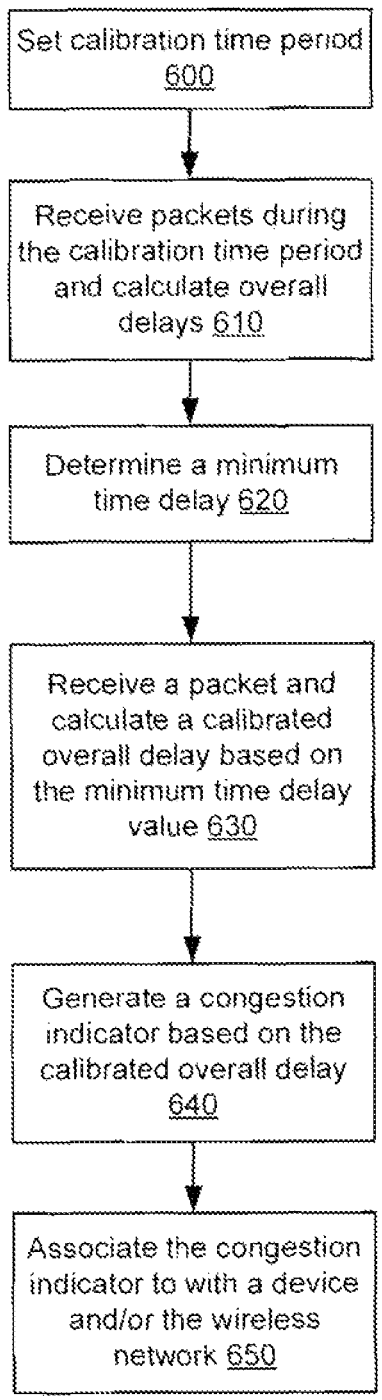
FIG. 6 is a flowchart that illustrates a method for calculating a congestion indicator based on a minimum time delay, according to an embodiment of the invention.

Although a variety of quality metrics can be calculated based on parameters associated with and/or collected from a packet transmitted over a wireless network, FIGS. 4-6 illustrate several embodiments related to the calculation of a congestion indicator based on parameters associated with a captured RTP packet. Because back-off delay is an indicator of a congestion level of a wireless network, in these illustrative embodiments, the congestion indicator is calculated using delays, and in particular the back-off delay, associated with an RTP packet.

FIG. 4 is a time line that illustrates several delays that can contribute to the overall delay of a packet when transmitted from a mobile terminal over a wireless network. From these delays, back-off delay, and consequently a congestion indicator, can be estimated and/or calculated. The horizontal axis represents time and is shown as increasing from left to right.

Specifically, the figure shows an overall delay 450 that includes a processing delay 452, back-off delay 454, and transmission delay 456. The back-off delay 454 (the time between time 410 and 420) represents the time period that a packet is held before being transmitted because of network congestion and is thus an indicator of a wireless network's congestion level. A larger back-off delay 454 indicates a higher level of wireless network congestion and vice versa. The processing delay 452 (the time between time 400 and time 410) is the time that a processor within a mobile terminal uses to prepare a packet for transmission. The transmission delay 456 (the time between 420 and 430) represents the time period that a packet is transmitted wirelessly before being captured by, for example, a mobile monitoring device. In other embodiments, the overall delay 450 can include other delays such as, for example, interframe space delays.

The figure also shows several times that define the delays 450-456. An RTP packet is created by a mobile terminal (i.e., creation time) at time 400, the packet is ready for transmission at time 410, the packet is transmitted over the wireless network from the mobile terminal at time 420, and the RTP packet is captured (i.e., capture time) by, for example, a mobile monitoring device at time 430. The device that captures the RTP packet can be referred to as a capturing device.

If the processing delay 452 and the transmission delay 456 are very small compared (i.e., negligible) with the back-off delay 454, the overall delay 450 will be substantially equal to the back-off delay 454 and thus representative of a congestion level of a wireless network. In this scenario, the back-off delay 454, and consequently a congestion indicator, can be estimated by calculating the overall delay 450. The overall delay 450 can be calculated as the difference between the packet creation time 400 and the packet capture time 430. For example, if captured by a mobile monitoring device, the mobile monitoring device can record the time that the RTP packet was captured and can extract the packet creation time from, for example, the RTP packet header. The mobile monitoring device can use these values to calculate an overall delay that can then be used as an indicator of congestion. The congestion indicator can be associated with, for example, the mobile terminal that created the RTP packet, a mobile monitoring device that captured the RTP packet, and/or the wireless network over which the RTP packet was transmitted. In some embodiments, the mobile monitoring device that calculated the congestion indicator can send the value to, for example, a central server for distribution to a user such as a network administrator.

In several embodiments, the overall delay 450 can be calculated using a combination of one or more delays (e.g., transmission delay, processing delay) through one or more access points and/or one or more mobile terminals. Values for certain portions of the overall delay can be estimated and/or subtracted from the overall delay, if necessary. Also, in some embodiments, individual delays (e.g., transmission delay, back-off delay, processing delay) from one or more devices can be combined in any appropriate combination to make up an overall delay.

If the processing delay 452 and the transmission delay 456 are quite small (i.e., negligible) and/or constant compared with the back-off delay 454, the processing delay 452 and the transmission delay 456 can be subtracted from the overall delay 450 to obtain a measure of the back-off delay 454. If the processing delay 452 and the transmission delay 456 are subtracted from the overall delay 450 (assuming these are the only three delays), the overall delay 450 will be substantially equal to the back-off delay 454. For example, the transmission delay 456 and processing delay 452 can be estimated and subtracted from the overall delay 450 to obtain a value that is substantially equal to the back-off delay 454. The transmission delay 456, for example, can be estimated by multiplying minimum packet size with transmission speed. The processing delay 452 can be estimated, for example, based on measured processing capability and/or traffic load. These values can be obtained from information in one or more captured RTP packets.

Although calculating the back-off delay 454 was relatively straighforward in the scenario shown in FIG. 4, obtaining the back-off delay 454 for use as a congestion indicator can be complicated, for example, when the calibration of one or more time clocks is necessary. For example, in some embodiments, the mobile terminal creating an RTP packet can send RTP packets from a time zone that is different than that associated with a capturing device. Also, in some embodiments, the units used to measure time within a mobile terminal can be different than the units used to measure time by a capturing device. For example, a mobile terminal can measure time based on codec size and/or RTP payload while time as measured by a capturing device can be based on real-time (i.e., absolute time). In scenarios such as these, a time clock associated with the mobile terminal can be calibrated with (i.e., synchronized or adjusted to correspond with) a time clock associated with the capturing device so that delays will be calculated accurately and/or in a mode useful, for example, for a user. The calibration of time clocks for calculation of a congestion indicator using back-off delay is described in FIGS. 5-6.

FIG. 5 is a graph that illustrates an example embodiment where a minimum overall delay, $D_{min}$, is used to the calibrate a time clock of a capturing device (e.g., mobile monitoring device) with a time clock of a mobile terminal. The time clocks are calibrated so that after calibration, the calculated overall delays, d, will not only be substantially representative of back-off delay (an indicator of congestion) but will also be calibrated (i.e., real-time) rather than relative. An overall delay, d, that is calculated based on a calibration technique can be referred to as a calibrated overall delay. When the time clocks are not calibrated only relative delay measurements can be calculated. In some embodiments, a congestion indicator can be based on a relative overall delay measurement rather than a calibrated overall delay measurement.

As shown in FIG. 5, time line 500 shows the packet creation times (PCTs) for $PCT_0$ through $PCT(n)$ where $PCT(n)$ is the packet creation time, PCT, of the $n^{th}$ packet according to the time clock of the mobile terminal. Time measurements related to time line 500 increase in a downward direction. Time line 510, which shows time increasing in a downward direction, shows the packet capture times (CAPTs) for $CAPT_0$ through $CAPT(n)$ where $CAPT(n)$ is the packet capture time of the $n^{th}$ packet according to the time clock of the capturing device. The figure shows the overall delays d(g) through d(n) which are the overall delays, d, for the $g^{th}$ through the $n^{th}$ packets, respectively.

The time clocks associated with the mobile terminal and the capturing device are calibrated by, first, determining a minimum value of overall delay, $D_{min}$, and then using $D_{min}$ to adjust the time clock of the capturing device. The minimum overall delay, $D_{min}$, is determined from a sample of overall delays, d, calculated during a calibration time period 520 shown in FIG. 5. The overall delays, d, are the difference between the PCTs from the mobile terminal and corresponding CAPTs from the capturing device. Because the time clocks of the mobile terminal and the capturing device are, in this embodiment, not initially calibrated with one another, the overall delays, d, calculated during the calibration time period 520 are relative to one another and not calibrated (i.e., real-time).

Because back-off delay is variable and because transmission and processing delays can be assumed to be constant (and/or small) compared with back-off delay, if the calibration time period is long enough, eventually one or more RTP packets with little or substantially zero back-off delay will be found. The RTP packet with the minimum overall delay, $D_{min}$, will substantially correspond with a packet that has only processing delay and/or transmission delay. The probability that $D_{min}$ will represent only the processing and/or transmission delays depends on, for example, the length of the calibration time period 520 and the level of traffic load in a wireless network during that period. The calibration time period 520 can be chosen so that $D_{min}$ substantially represents only processing and/or transmission delays. By adjusting the time clock of the capturing device by $D_{min}$, subsequent delays, d, calculated using the difference between the PCTs and CAPTs will be substantially representative of only back-off delay. In some embodiments, the calibration time period can be, for example, 1 second and in other embodiments, the calibration time period can be, for example, 24 hours.

FIG. 5 shows that from all of the overall time delays d(g) through d(n) calculated during the calibration time period 520, d(l) is determined to be the minimum overall delay, $D_{min}$. At time 530, the time clock associated with the capturing device is adjusted (i.e., calibrated) by $D_{min}$ so that subsequent delays, d, will be calibrated and will substantially represent back-off delay. The overall delay, d(o), which is the difference between PCT(o) and CAPT(o), is calculated using the adjusted time clock of the capturing device. The overall delay, d(o) is a calibrated overall delay (i.e., real-time overall delay) that is substantially representative of back-off delay and can be used as an indicator of congestion.

Although in this embodiment, the time clock associated with the capturing device is adjusted forward by $D_{min}$, in some embodiments, the time clock associated with the mobile terminal and/or the capturing device can be adjusted, if necessary. In yet other embodiments, the uncalibrated overall delays can be adjusted by the minimum overall delay (e.g., subtract the minimum delay) to derive an calibrated overall delay. In these scenarios, time clocks associated with the mobile terminal and/or the capturing device do not need to be adjusted.

In some embodiments, the minimum overall delay can be updated and used to adjust delay calculations continuously as smaller minimum delays are found during normal wireless network operations. In other embodiments, a mobile terminal and capturing device can synchronize their respective time clocks with a network timing protocol (NTP) server so that calculated delay values for packets can be based on a synchronized time. In several embodiments, a minimum overall delay can be first estimated and then updated with overall delay values collected during normal wireless network operations. For example, the transmission delay can be estimated based on a minimum packet size and/or transmission speed and the processing delay can be estimated based on a measured processing capability and/or traffic load.

FIG. 6 is a flowchart that illustrates a method for calculating a congestion indicator based on a minimum time delay. The figure shows that, first, a calibration time period is set at 600. The calibration time period is set so that a high probability exists that a minimum delay can be found that substantially represents only processing and/or transmission delays. After the calibration time period is set at 600, packets are received (i.e., captured) during the calibration time period and overall delays are calculated 610. From the group of overall delays calculated using information from captured packets during the calibration time period, a minimum time delay is determined 620.

A packet(s) is then received (i.e., captured) and a calibrated overall delay is calculated based on the minimum time delay value at 630. The minimum time delay value can be used to calibrate the time clocks of, for example, a mobile terminal and/or a capturing device so that the overall delay calculated using parameters associated with the captured packet will be substantially representative of back-off delay. In some embodiments, the minimum delay can also be subtracted from an overall delay value calculated using a packet creation time and packet capture time that are not calibrated with one another.

After the calibrated overall delay is calculated at 630, the calibrated overall delay is used to generate (i.e., calculate) a congestion indicator 640. The congestion indicator can be a value that is derived using, for example, any appropriate mathematical algorithm based on the calibrated overall delay. Finally, the flowchart shows that the congestion indicator is associated with a device (e.g., mobile terminal and/or capturing device) and/or a wireless network (e.g., wireless LAN) at 650.

In some embodiments, a congestion indicator can be generated using more than one calibrated overall delay value calculated using data associated with more than one captured packet. The congestion indicator can be calculated using a mathematical combination of calibrated overall values, such as, for example, a mean calibrated overall value. Also, in several embodiments, a congestion indicator can be sent to another device for use by, for example, a user. In other embodiments, the minimum overall delay value can be updated continuously as packets are captured to calculate calibrated overall delay values. The congestion indicator can be updated as the minimum overall delay value is updated and/or as calibrated overall delay values are calculated. In yet other embodiments, packets that are received can be filtered so that calibrated overall delay values are calculated using only selected packets.

CONCLUSION

In conclusion, an apparatus and method for measuring quality metrics associated with a wireless network is described. While various embodiments of the invention have been described above, it should be understood that they have been presented by way of example only and various changes in form and details may be made.

The invention claimed is:

1. A method comprising:
capturing a first packet transmitted over a network;
determining, using a processor, an overall delay for each of a plurality of packets captured during a predetermined time period prior to the capturing of the first packet, to provide a set of overall delays, each overall delay being a difference between a creation time of a particular packet and a time when the particular packet was captured;
determining a minimum delay by identifying one of the plurality of packets having a smallest overall delay in the set of overall delays, wherein the smallest overall delay is different from the minimum delay;
setting the minimum delay to the smallest overall delay; and
altering one or more parameters of the network based on the minimum delay, to reduce congestion in the network based on the overall delay of the first packet and the minimum delay.

2. The method of claim 1, wherein each of the plurality of packets captured prior to the capturing of the first packet were captured during a calibration time period.

3. The method of claim 1, wherein one of the altered parameters of the network includes a time clock of a capturing device.

4. The method of claim 1, further comprising:
determining an overall delay of the first packet; and
updating the minimum delay using the overall delay of the first packet.

5. The method of claim 1, wherein the first packet is selected from a subset of packets filtered from the plurality of packets based on a filter criterion.

6. The method of claim 1, further comprising calculating a congestion indicator based on the minimum delay.

7. The method of claim 6, further comprising associating the congestion indicator with a terminal that created the first packet.

8. The method of claim 6, further comprising associating the congestion indicator with a monitoring device that captured the first packet.

9. The method of claim 6, further comprising associating the congestion indicator with the network.

10. A system comprising:
a receiver module configured to receive a first packet transmitted over a network; a processor configured to:
capture a first packet transmitted over a network;
determine, using a processor with a memory, an overall delay for each of a plurality of packets captured during a predetermined time period prior to the capturing of the first packet, to provide a set of overall delays, each overall delay being a difference between a creation time of a particular packet and a time when the particular packet was captured;
determine a minimum delay by identifying one of the plurality of packets having a smallest overall delay in the set of overall delays, wherein the smallest overall delay is different from the minimum delay;
set the minimum delay to the smallest overall delay; and
alter one or more parameters of the network based on the minimum delay, to reduce congestion in the network based on the overall delay of the first packet and the minimum delay.

11. The system of claim 10, wherein one of the altered parameters of the network includes a time clock of a capturing device.

12. The system of claim 10, wherein the processor is further configured to:
determine an overall delay of the first packet; and
update the minimum delay using the overall delay of the first packet.

13. The system of claim 10, wherein the processor is further configured to calculate a congestion indicator based on the minimum delay.

14. The system of claim 13, wherein the processor is further configured to associate the congestion indicator with a terminal that created the first packet.

15. The system of claim 13, wherein the processor is further configured to associate the congestion indicator with a monitoring device that captured the first packet.

16. The system of claim 13, wherein the processor is further configured to associate the congestion indicator with the network.

17. A non-transitory machine-readable storage medium comprising a set of instructions which, when executed by a processor, causes execution of operations comprising: capturing a first packet transmitted over a network;
determining, using a processor with a memory, an overall delay for each of a plurality of packets captured during a predetermined time period prior to the capturing of the first packet, to provide a set of overall delays, each overall delay being a difference between a creation time of a particular packet and a time when the particular packet was captured;
determining a minimum delay by identifying one of the plurality of packets having a smallest overall delay in the set of overall delays, wherein the smallest overall delay is different from the minimum delay;
setting the minimum delay to the smallest overall delay; and
altering one or more parameters of the network based on the minimum delay, to reduce congestion in the network based on the overall delay of the first packet and the minimum delay.

18. The non-transitory machine-readable storage medium of claim 17, wherein each of the plurality of packets captured prior to the capturing of the first packet were captured during a calibration time period.

19. The non-transitory machine-readable storage medium of claim 17, wherein one of the altered parameters of the network includes a time clock of a capturing device.

20. The non-transitory machine-readable storage medium of claim 17, wherein the operations further comprise:
determining an overall delay of the first packet; and
updating the minimum delay using the overall delay of the first packet.

* * * * *